United States Patent [19]
Söderberg et al.

[11] Patent Number: 5,942,318
[45] Date of Patent: Aug. 24, 1999

[54] COATED CUTTING INSERT

[75] Inventors: Staffan Söderberg, Huddinge; Åsa Kutscher; Leif Åkesson, both of Älvsjö, all of Sweden

[73] Assignee: Sandvik AB, Sandviken, Sweden

[21] Appl. No.: 08/886,192

[22] Filed: Jul. 1, 1997

[30] Foreign Application Priority Data

Jul. 11, 1996 [SE] Sweden ................................ 9602753

[51] Int. Cl.$^6$ ........................... C23C 16/30; C23C 16/36
[52] U.S. Cl. .............................. 428/216; 57/307; 57/309; 407/119; 427/255; 427/255.1; 427/255.2; 427/255.7; 428/336; 428/469; 428/698
[58] Field of Search ................... 428/698, 336, 428/216, 469; 51/307, 309; 427/255, 255.1, 255.2, 255.7; 407/119

[56] References Cited

U.S. PATENT DOCUMENTS

| | | | |
|---|---|---|---|
| 4,101,703 | 7/1978 | Schintlmeister | 428/216 |
| 4,237,184 | 12/1980 | Gonseth et al. | 428/336 |
| 4,399,168 | 8/1983 | Kullander et al. | 428/698 |
| 4,447,263 | 5/1984 | Sugizawa et al. | 75/233 |
| 4,599,281 | 7/1986 | Schintlmeister et al. | 428/699 |
| 4,610,931 | 9/1986 | Nemeth et al. | 428/547 |
| 4,743,515 | 5/1988 | Fischer et al. | 428/698 |
| 5,135,801 | 8/1992 | Nyström et al. | 428/216 |
| 5,266,388 | 11/1993 | Santhanam et al. | 428/212 |
| 5,374,471 | 12/1994 | Yoshimura et al. | 428/216 |
| 5,403,652 | 4/1995 | Drougge | 428/216 |
| 5,436,071 | 7/1995 | Odani et al. | 428/698 |
| 5,451,469 | 9/1995 | Gustafson et al. | 425/548 |
| 5,652,045 | 7/1997 | Nakamura et al. | 428/216 |

FOREIGN PATENT DOCUMENTS

| | | |
|---|---|---|
| 0 337 696 | 10/1989 | European Pat. Off. . |
| 0 530 779 | 3/1995 | European Pat. Off. . |
| 0 678 594 | 10/1995 | European Pat. Off. . |
| 55-83507 | 6/1980 | Japan . |

OTHER PUBLICATIONS

Dialog Information Services, File 351, World Patent Index 81–96, Dialog Accession No. 010641197, WPI Accession No. 96–138150/199614, Chebosky Khiprom PRDN Assoc: "Titanium Nitride Film Removal from Surface of Stainless Steel Articles—comprises treatment in potassium hydrate prior to treating the article in hot soln. of a mineral acid"; & RU,C1,2039851, 19950720, 920817, 199614 B.

Patent Abstracts of Japan, vol. 13, No. 156, C–585, Abstract of JP, A,63–313000 (Seiko Instr & Electronics Ltd.), Dec. 21, 1988.

Patent Abstracts of Japan, abstract of JP,A,08132130, published May 28, 1996 & JP–A–08132130.

Patent Abstracts of Japan, abstract of JP,A,06158325, published Jun. 7, 1994 & JP–A–06158325.

English translation of JP 30406–1990.
English translation of JP 62–192576.
English Translation of JP 54–733292.
English abstract of SS100978.

*Primary Examiner*—Archene Turner
*Attorney, Agent, or Firm*—Burns, Doane, Swecker & Mathis, L.L.P.

[57] ABSTRACT

There is provided a coated cutting insert particularly useful for finishing operations in milling of grey cast iron. The insert has a fine-grained WC-Co cemented carbide body and a coating of multiple layers of $TiC_xN_y$ deposited at conditions aiming to minimize the decarburization of the cutting edge without any negative effects on the substrate. There is also disclosed a method of applying a $TiC_xN_y$ layer by CVD technique on a cemented carbide cutting insert without eta phase formation and without etching of the binder phase.

27 Claims, 2 Drawing Sheets

COATED CUTTING INSERT

BACKGROUND OF THE INVENTION

The present invention relates to a coated cutting tool (cemented carbide insert) particularly useful for finishing operations in milling of grey cast iron.

Grey cast iron is a material which, in general, is reasonably easy to machine with cemented carbide tools and long tool life can often be obtained. However, the machinability of cast iron can vary considerably. The tool life may be influenced significantly by small variations in the chemical composition within the material. These variations may be related to the casting technique used such as the cooling conditions. In the finishing operation, the surface finish of the machined work piece is extremely important. It is also as important to avoid frittering of the work piece on the exit side. This puts very high demands on the wear behavior of the cutting edge of the cutting tool, especially close to the corner between the main cutting edge and the parallel land which creates the surface of the work piece.

Measures can be taken to improve the cutting performance with respect to a specific property, but often such action may have a negative influence on other cutting properties as indicated below:

- a very sharp cutting edge, i.e., with an edge radius (ER) of about 15 μm or less, minimizes the risk of frittering of the work piece and normally gives a very good surface finish on the component. However, this makes the cutting edge very sensitive to microchipping and for coated cutting inserts also sensitive to flaking;
- uncoated cutting inserts with high toughness (e.g., a cemented carbide with a high binder phase content) can be used with a very sharp cutting edge but they have a poor wear resistance and a short tool life;
- coating of the inserts in order to improve the wear resistance properties are commonly used. But inserts with very sharp cutting edges are particularly susceptible to decarburization and eta phase formation when subjected to a conventional CVD coating process. The eta phase embrittles the edge line and decreases the flaking resistance and thus also the tool life due to bad surface finish of the work piece. Therefore, conventionally CVD coated inserts generally have an edge radius of about 25 μm as a minimum; and PVD coating, using known technique, is recognized to make possible the coating of very sharp edges without eta phase formation. However, in the milling of grey cast iron, severe flaking of this type of coating often occurs which deteriorates the wear resistance and tool life of the insert.

The normally used process parameters in conventional CVD technique, e.g., temperature, pressure and gas composition are a compromise in order to obtain the best combination of growth rate, uniformity and cutting properties avoiding, e.g., undesirable reactions between gas phase and the cemented carbide body, such as etching of the binder phase or decarburization of the insert surface especially the edge line.

A method to avoid decarburization using intermediate oxygen-containing layers is described in certain prior art instances, e.g., U.S. Pat. No. 5,135,801.

OBJECTS AND SUMMARY OF THE INVENTION

It is an object of this invention to avoid or alleviate the problems of the prior art.

It is further an object of this invention to provide a coated cutting tool particularly useful for finishing operations in milling of grey cast iron.

In one aspect of the invention there is provided a cutting tool insert for finishing milling of grey cast iron comprising a cemented carbide body and a coating applied by CVD technique, said cemented carbide body being free of eta phase, particularly in the edge line and consisting essentially of WC with a mean grain size of <2 μm, 5–15 weight % Co and <0.5 weight % cubic carbides of metals from groups IVb, Vb or VIb of the periodic table of the elements and said coating comprising a 0.5–3 μm layer of $TiC_xN_y$ with x+y=1 and x>0.3 and y>0.3.

In another aspect of the invention there is provided a cutting tool insert for finishing milling of grey cast iron comprising a cemented carbide body and a coating applied by CVD technique, said cemented carbide body being free of eta phase, particularly in the edge line and consisting essentially of WC with a mean grain size of <2 μm, 5–15 weight % Co and <0.5 weight % cubic carbides of metals from groups IVb, Vb or VIb of the periodic table of the elements and said coating comprising

- an inner layer of $TiC_xN_y$ with x+y=1 with a thickness of 0.1–2 μm;
- a layer of $TiC_xN_y$ where x+y=1 having a thickness of 0.5–3 μm; and
- an outer layer of $TiC_xN_y$ with x+y=1 with a thickness of 0.5–2.5 μm.

In yet another aspect of the invention there is provided a method of depositing a $TiC_xN_y$ layer on a cemented carbide insert by CVD technique without eta phase formation and without etching of the binder phase comprising operating a CVD coating process with a pressure during the whole process between 750 mbar and atmospheric and a temperature between 900 and 970° C., introducing gases in the order $H_2$, $N_2$, optionally $CH_4$ and $TiCl_4$, followed by HCl, keeping the amount of $TiCl_4$ between 1.5% and 5% and the amount of HCl between 1.0% and 6%.

DETAILED DESCRIPTION OF THE PREFERRED EMBODIMENTS OF THE INVENTION

Figure 1:
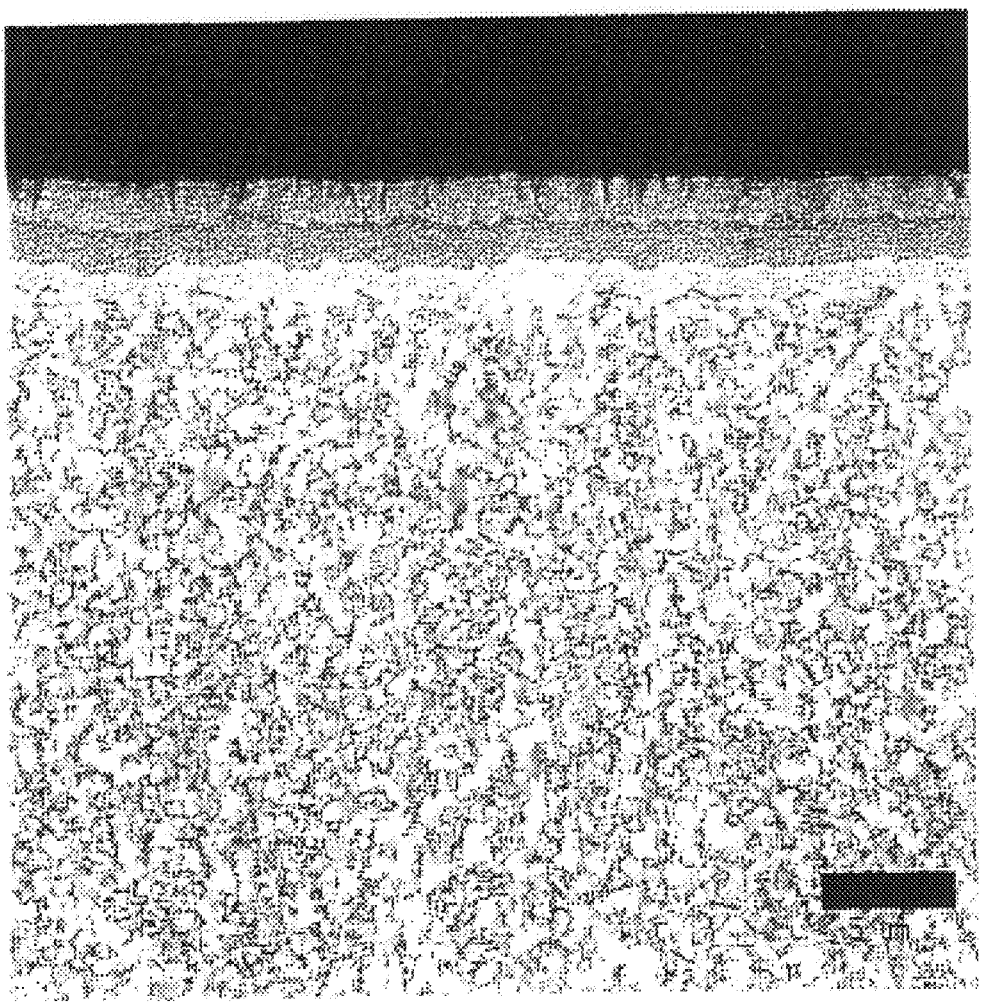
FIG. 1 is a micrograph in 2000× magnification of a coated insert according to the present invention in which
A—cemented carbide body
B—$TiC_xN_y$
C—grey $TiC_xN_y$
D—yellow $TiC_xN_y$

It has surprisingly been found that by combining a straight WC-Co cemented carbide body having a very fine-grained WC structure with a coating consisting essentially of one or multiple $TiC_xN_y$ layers, an excellent cutting tool for finishing operations in milling of grey cast iron can be obtained. Furthermore, it has been found that by using a carefully controlled CVD process, the inserts can be coated without decarburization and eta phase formation and without etching of the binder phase. The edge radius can be down to 20 μm.

According to the present invention, a cutting tool insert is provided consisting essentially of a cemented carbide body and a CVD coating whereby the cemented carbide has the composition 5–15 weight % Co, preferably 6–11 weight % Co, <0.5 weight %, preferably <0.2 weight %, cubic carbides of the metals Ti, Ta and/or Nb and balance WC. The mean grain size of the WC is <2 $\mu$m, preferably 0.5–1.5 $\mu$m, most preferably 0.7–1.3 $\mu$m. The cobalt binder phase may be alloyed with small amounts of, e.g., Cr<0.5 weight % as a grain growth inhibitor.

The coating comprises:

a first (innermost) CVD layer of $TiC_xN_y$ with x+y=1, y>0.7, preferably y>0.9, with a thickness of 0.1–2 $\mu$m, preferably 0.5–1.5 $\mu$m;

a second CVD layer of $TiC_xN_y$ with x+y=1, with x>0.3 and y>0.3, with a thickness of 0.5–3.0 $\mu$m, preferably 1–2.5 $\mu$m; and a third, yellow CVD layer of $TiC_xN_y$ with x+y=1 and x<0.05, with a thickness of 0.5–2.5 $\mu$m, preferably 0.5–1.5 $\mu$m.

The coating may contain oxygen as an impurity only. The total thickness of the coating should be between 2 and 6 $\mu$m, preferably 3 and 5 $\mu$m. The second layer is preferably thicker than each of the other two. Preferably, the coating contains only carbides, nitrides and/or carbonitrides of Ti.

The coating may comprise only one or two of the above-mentioned layers. It is also within the scope of the present invention to make the coating a multiple of the above-mentioned layers in any combination. The total coating thickness should be between 2 and 6 $\mu$m, preferably 3 and 5 $\mu$m.

According to the method of the invention, a WC-Co based cemented carbide body having a very fine-grained WC structure is coated, using CVD technique, with:

a first (innermost) layer of $TiC_xN_y$ with x+y=1, y>0.7, preferably y>0.9, with a thickness of 0.1–2 $\mu$m, preferably 0.5–1.5 $\mu$m, using a carefully controlled CVD process which enables the inserts to be coated without decarburization and eta phase formation except in occasional small spots and without etching of the Co binder phase. The pressure should during the whole process, be controlled to be between 750 mbar up to atmospheric, preferably above 900 mbar and the temperature should be kept between 900° C. and 970° C. The gases are introduced into the reactor vessel in the order $H_2$, $N_2$ and $TiCl_4$ followed by HCl. The amount of $TiCl_4$ should be kept between 1.5% and 5%, preferably between 2.0% and 3.5% and the amount of HCl should be controlled to be between 1% and 6%, preferably 1.5%–4%. The exact conditions, however, depend to a certain extent on the design of the equipment used;

a second layer of $TiC_xN_y$ with x+y=1, with x>0.3 and y>0.3, with a thickness of 0.5–3 $\mu$m, preferably 1–2.5 $\mu$m. The pressure and temperature are kept the same as for the innermost coating layer, but $CH_4$ is added to the gas mixture in an mount of 8–20%, preferably 10–18%. The process may be performed with HCl concentrations between 0% and 3% and the amount of $N_2$ shall be kept at 1%–40%, preferably 5%–20%; and a third, yellow layer of $TiC_xN_y$ with x+y=1 and x<0.05, with a thickness of 0.5–2.5 $\mu$m, preferably 0.5–1.5 $\mu$m, deposited at process conditions mainly as for the first, innermost layer.

A smooth coating surface layer with a surface roughness $R_{max} \leq 0.4$ $\mu$m over a length of 10 $\mu$m is obtained using a wet or dry blasting treatment of the coated cutting insert surface with fine-grained (400-150 mesh) alumina powder as has been disclosed in U.S. Ser. No. 08/497,934 (our reference: 024444-144).

Figure 2:
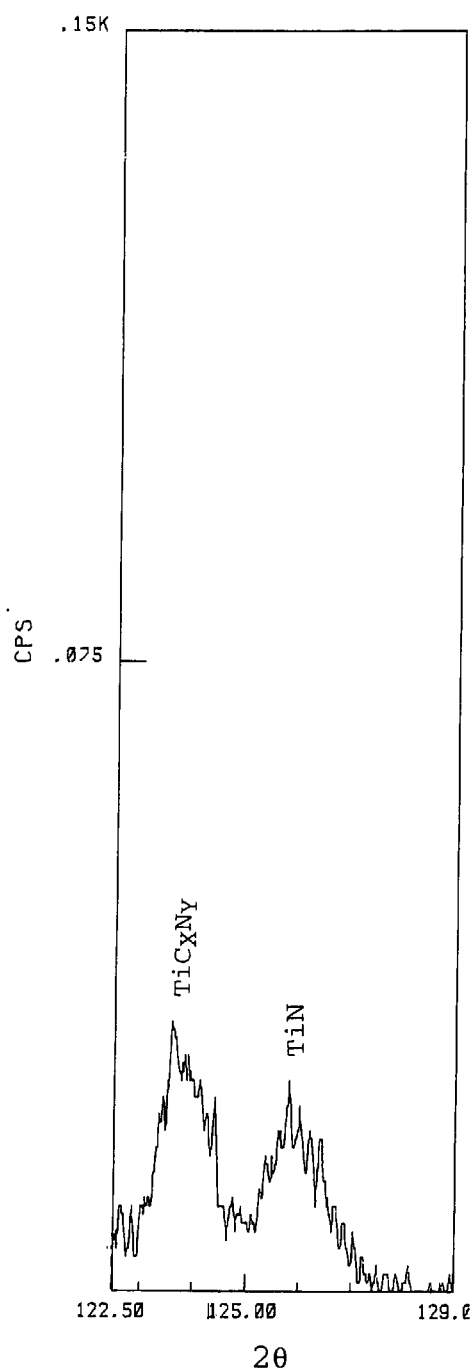
FIG. 2 is an X-ray diffraction pattern from a coating according to the present invention showing the (422)-peaks from TiN and $TiC_xN_y$, respectively, after blasting.
Figure 3:
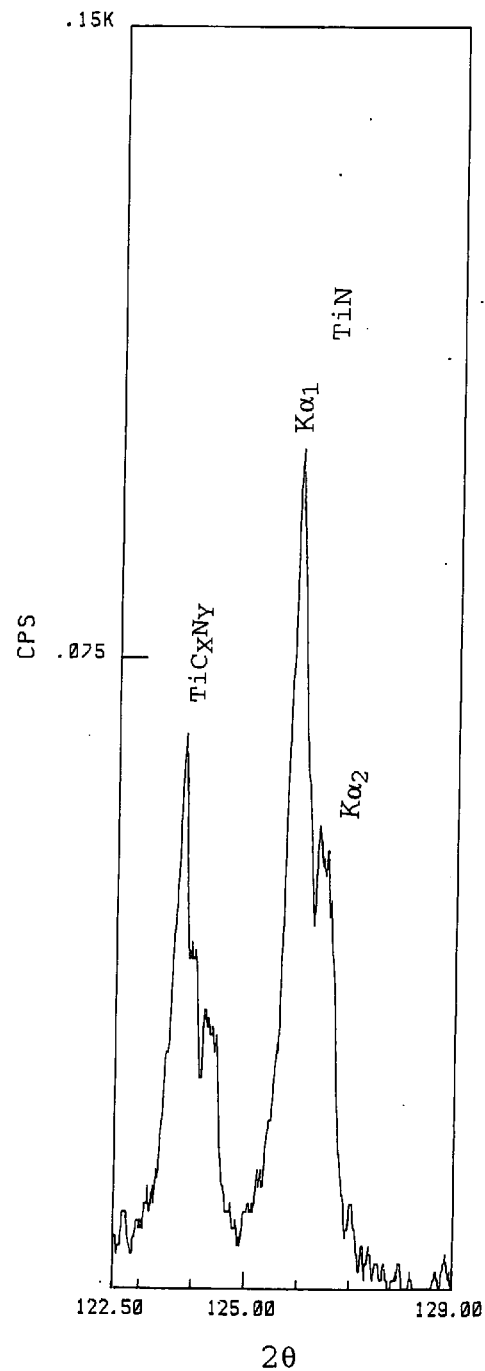
FIG. 3 is an X-ray diffraction pattern from a coating according to the present invention showing the (422)-peaks from TiN and $TiC_xN_y$, respectively, after blasting and heat treatment.

It has been found that this blasting treatment considerably changes the X-ray spectrum of the coating, e.g., when using Cu K-$\alpha_{1,2}$ as X-ray radiation source. This can be measured as a difference in peak height of the (422)-reflection of the TiN and/or TiCN of a blasted and a blasted and heat treated coated insert. The heat treatment may be performed at about 800° C. in hydrogen atmosphere for 1 hour. Dividing the peak height values before and after the heat treatment, a ratio (from here on referred to as the "(422)-ratio") is obtained, see FIGS. 2 and 3.

$$(422)\text{-ratio} = \frac{(422 \text{ peak height})_{blasted\ and\ heat\ treated}}{(422 \text{ peak height})_{blasted}}$$

The (422)-ratio of the $TiC_xN_y$ layer with x>0.3 and y>0.3, has been found to be >1.5, preferably >1.75.

Furthermore, it has been found that the blasting treatment affects the presence of the so-called $K\alpha_2$ reflection of the (422)-peak, especially for the $TiC_xN_y$ layer with x<0.05. Before the blasting treatment and also after the heat treatment of the blasted insert, this reflection appears as a shoulder or a small peak on the right side of the $K\alpha_1$ reflection, whereas in the blasted condition, this $K\alpha_2$ reflection cannot be detected due to the broadening of the main $K\alpha_1$ peak, see FIGS. 2 and 3. Instead of blasting, other mechanical treatment giving the same result may be used.

The invention is additionally illustrated in connection with the following Examples which are to be considered as illustrative of the present invention. It should be understood, however, that the invention is not limited to the specific details of the Examples.

Example 1

A. Cemented carbide milling inserts of a special finishing type N260.8-1204-F with the composition 6.0 weight % Co and balance WC with a mean WC grain size of about 1.3 $\mu$m, were edge rounding treated to an ER size of about 20 $\mu$m and coated with a TiN-$TiC_xN_y$-TiN-layer (about x=0.45 and y=0.55) with the individual coating thicknesses 1.4 $\mu$m, 2.0 $\mu$m and 1.2 $\mu$m, respectively.

The CVD process conditions were as follows:

| Gas Mixture | Step 1 | Step 2 | Step 3 |
|---|---|---|---|
| $TiCl_4$ | 2.5% | 3.3% | 2.5% |
| $N_2$ | 45% | 8% | 45% |
| HCl | 3.3% | — | 3.3% |
| $CH_4$ | — | 14% | — |
| $H_2$ | balance | balance | balance |
| Pressure | atmospheric in all steps | | |
| Temperature | 930° C. | 930° C. | 930° C. |
| Duration | 1.5 hours | 2 hours | 1.5 hours |

The inserts were smoothed by wet basting after the coating procedure. No eta phase was found in the edge line. One insert was investigated by X-ray diffraction and then heat treated in hydrogen atmosphere at 800° C. for 1 hour and the X-ray investigated again. The (422)-ratio of the TiCN layer was measured to be 2.0 and no $K\alpha_2$ reflection could be detected for the TiN peak in the blasted condition.

B. Cemented carbide milling inserts of the same type as in A, with the composition 10.0 weight % Co, 0.4 weight %

Cr and balance WC with a mean WC grain size of about 0.9 µm and with an ER size of about 20 µm, were coated under the procedure given in A. The thicknesses of the individual coating layers TiN-TiC$_x$N$_y$-TiN were 1.4 µm, 2.0 µm and 1.2 µm, respectively. After coating, the inserts were smoothed by wet blasting. No eta phase was found in the edge line. One insert was investigated by X-ray diffraction and then heat treated in hydrogen atmosphere at 800° C. for 1 hour and then X-ray investigated again. The (422)-ratio of the TiCN layer was measured to be 1.8 and no K$\alpha_2$ reflection could be detected for the TiN-(422)-peak in the blasted condition.

C. Cemented carbide milling inserts with the composition and coating as in A, but without the blasting treatment of the coating. In the X-ray spectrum of these inserts, the K$\alpha_2$ reflection for the TiN-(422)-peak could clearly be observed.

D. Milling inserts from the same batch as in A were coated with an equiaxed 2.0 µm TiC coating and a 1.0 µm Al$_2$O$_3$ layer according to prior art CVD technique. The eta phase zone in the edge line was about 5 µm thick.

E. Milling inserts from the same batch as in A were coated with a 3.5 µm PVD-TiCN coating according to prior art technique. No eta phase was found in the edge line.

F. Milling inserts from the same batch as in A were coated with a 4 µm PVD-TiN coating according to prior art technique. No eta phase was found in the edge line.

G. Cemented carbide milling inserts of the same type as in A with the composition 7.3 weight % Co, 7.7 weight % TiC and balance WC with a mean grain size for WC of about 1.5 µm, were ER treated to an ER size of about 15 µm and used uncoated.

Example 2

Inserts A–G from Example 1 were tested as below:
Operation: face milling with SANDVIK NF (N260.8)
Cutter Diameter: 200 mm
Workpiece: specially designed component with pre-machined surface
Material: SS0125 (grey cast iron HB=205)
Cutting speed: 140 m/min and 290 m/min, respectively
Feed rate: 0.18 mm/tooth
Depth of cut: 0.5 mm
Insert type: N260.8-1204-F The operation was run both with and without coolant (wet and dry). Tool life criterion was surface finish of the work piece and the tool life given below is a mean value of two or three tested edges/variant.

| RESULTS: | Cutting Speed: 140 m/min Tool life, number of components | |
| --- | --- | --- |
| Grade Variant | Wet | Dry |
| A. (invention) | 38 | 35 |
| B. (invention) | 35 | 30 |
| C. (invention) | 29 | 23 |
| D. (prior art, CVD) | 15 | 14 |
| E. (prior art, PVD-TiCN) | 8 | 30 |
| F. (prior art, PVD-TiN) | 5 | 27 |
| G. (prior art, uncoated) | 29 | 23 |

Inserts D, E, and F were susceptible to flaking close to the edge line, especially on the parallel land. This behavior was most pronounced for inserts E and F in wet milling. Insert G got a more rapid flank wear than inserts A and B.

| RESULTS: | Cutting Speed: 290 m/min Tool life, number of components | |
| --- | --- | --- |
| Grade Variant | Wet | Dry |
| A. (invention) | 23 | 15 |
| B. (invention) | 20 | 10 |
| C. (invention) | 15 | 14 |
| D. (prior art, CVD) | 15 | 8 |
| E. (prior art, PVD-TiCN) | 13 | 13 |
| F. (prior art, PVD-TiN) | 10 | 7 |
| G. (prior art, uncoated) | 13 | 7 |

At this higher cutting speed, inserts D, E, and F got flaking on the edge line, but they also got a more rapid normal flank wear than insert A. Insert G was also less wear resistant than insert A, especially in dry milling. At this high cutting speed, insert B was susceptible to plastic deformation during the dry milling operation. It is evident that inserts according to the invention perform well in both wet and dry machining in a wide cutting speed range.

Example 3

Inserts A–G from Example 1 were tested as below:
Operation: face milling with SANDVIK NF (N260.8)
Cutter Diameter: 200 mm
Workpiece: specially designed component with several holes with cast skin at the surface inside the holes but pre-machined upper surface
Material: SS0125 (grey cast iron HB=205)
Cutting speed: 130 m/min
Feed rate: 0.20 mm/tooth
Depth of cut: 0.5 mm
Insert type: N260.8-1204-F The operation was run with coolant. Tool life criterion was chipping of the edge line due to inclusions in the cast skin. The tool life given below is a mean value of the three tested edges/variant.

| RESULTS: Grade Variant | Cutting Speed: 130 m/min Tool life, number of components |
| --- | --- |
| A. (invention) | 29 |
| B. (invention) | 38 |
| C. (invention) | 22 |
| D. (prior art, CVD) | 11 |
| E. (prior art, PVD-TiCN) | 19 |
| F. (prior art, PVD-TiN) | 21 |
| G. (prior art, uncoated) | 20 |

Insert B was superior due to its outstanding toughness behavior.

From these milling tests, it is evident that inserts according to the invention show a broader and higher performance level compared to inserts according to prior art.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A cutting tool insert for finishing milling of grey cast iron, said insert having an edge line, said insert comprising a cemented carbide body and a coating applied by CVD technique, said cemented carbide body being free of eta phase in the edge line and consisting essentially of WC with a mean grain size of <2 µm, 5–15 weight % Co and <0.5 weight % cubic carbides of metals from groups IVb, Vb or VIb of the periodic table of the elements and said coating comprising a 0.5–3 µm layer of TiC$_x$N$_y$ with x+y=1 and x>0.3 and y>0.3, and said coating is treated at about 800° C. in hydrogen for 1 hour, the treated coating has an X-ray diffraction pattern with a (422)-ratio >1.5, where the (422) ratio is defined as $$(422)\text{-ratio} = \frac{(422 \text{ peak height})_{after\ heat\ treatment}}{(422 \text{ peak height})_{before\ heat\ treatment}}.$$

2. The cutting tool insert of claim 1 wherein the thickness of the TiC$_x$N$_y$ layer is 1–2.5 µm.

3. The cutting tool insert of claim 1 where said (422)-ratio is >1.75.

4. The cutting tool insert of claim 1 wherein said coating is blasted.

5. The cutting tool insert of claim 4 wherein the α$_2$ reflection of the (422)-peak from the TiC$_x$N$_y$ layer with x<0.05 cannot be detected in the X-ray spectrum.

6. The cutting tool insert of claim 1 wherein the grain size of the WC in the cemented carbide insert is <2 µm.

7. The cutting tool insert of claim 4 wherein the grain size of the WC in the cemented carbide insert is 0.5–1.5 µm.

8. The cutting tool insert of claim 4 wherein the grain size of the WC in the cemented carbide insert is 0.7–1.3 µm.

9. The cutting tool insert of claim 1, wherein said edge line defines a radius of curvature of less than 25 µm.

10. A cutting tool insert for finishing milling of grey cast iron, said insert having an edge line, said insert comprising a cemented carbide body and a coating applied by CVD technique, said cemented carbide body being free of eta phase in the edge line and consisting essentially of WC with a mean grain size of <2 µm, 5–15 weight % Co and <0.5 weight % cubic carbides of metals from groups IVb, Vb or VIb of the periodic table of the elements and said coating comprising
an inner layer of TiC$_x$N$_y$ with x+y=1 where y>0.7, with a thickness of 0.1–2 µm;
a layer of TiC$_x$N$_y$ where x+y=1 where x>0.3 and y>0.3, having a thickness of 0.5–3 µm; and
an outer layer of TiC$_x$N$_y$ with x+y=1 where x<0.05, with a thickness of 0.5–2.5 µm; and
said coating is treated at about 800° C. in hydrogen for 1 hour, the treated coating has an X-ray diffraction pattern with a (422)-ratio >1.5, where the (422) ratio is defined as $$(422)\text{-ratio} = \frac{(422 \text{ peak height})_{after\ heat\ treatment}}{(422 \text{ peak height})_{before\ heat\ treatment}}.$$

11. The cutting tool insert of claim 10 wherein x<0.3 in the TiC$_x$N$_y$ inner layer.

12. The cutting tool insert of claim 10 wherein y>0.9 in the TiC$_x$N$_y$ inner layer.

13. The cutting tool insert of claim 10 wherein the TiC$_x$N$_y$ inner layer has a thickness of 0.5–1.5 µm.

14. The cutting tool insert of claim 10 wherein x<0.1 in the TiC$_x$N$_y$ outer layer.

15. The cutting tool insert of claim 10 wherein the TiC$_x$N$_y$ outer layer has a thickness of 0.5–1.5 µm.

16. The cutting tool insert of claim 10, wherein said edge line defines a radius of curvature of less than 25 µm.

17. A cutting tool insert for finishing milling of grey cast iron, said insert having an edge line, said insert comprising a cemented carbide body and a coating applied by CVD technique, said cemented carbide body being free of eta phase in the edge line and consisting essentially of WC with a mean grain size of <2 µm, 5–15 weight % Co and <0.5 weight % cubic carbides of metals from groups IVb, Vb or VIb of the periodic table of the elements and said coating comprising
an inner layer of TiC$_x$N$_y$ with x+y=1, with a thickness of 0.1–2 µm;
a layer of TiC$_x$N$_y$ where x+y=1, with a thickness of 0.5–3 µm; and
an outer layer of TiC$_x$N$_y$ with x+y=1, with a thickness of 0.5–2.5 µm; and
said coating is treated at about 800° C. in hydrogen for 1 hour, the treated coating has an X-ray diffraction pattern with a (422)-ratio>1.5, where the (422) ratio is defined as $$(422)\text{-ratio} = \frac{(422 \text{ peak height})_{after\ heat\ treatment}}{(422 \text{ peak height})_{before\ heat\ treatment}}.$$

18. The cutting tool insert of claim 17 wherein x<0.3 and y>0.7 in the TiC$_x$N$_y$ inner layer.

19. The cutting tool insert of claim 17 wherein y>0.9 in the TiC$_x$N$_y$ inner layer.

20. The cutting tool insert of claim 17 wherein the TiC$_x$N$_y$ inner layer has a thickness of 0.5–1.5 µm.

21. The cutting tool insert of claim 17 wherein x<0.1 in the TiC$_x$N$_y$ outer layer.

22. The cutting tool insert of claim 17 wherein the TiC$_x$N$_y$ outer layer has a thickness of 0.5–1.5 µm.

23. The cutting tool insert of claim 17, wherein said edge line defines a radius of curvature of less than 25 µm.

24. A method of depositing a TiC$_x$N$_y$ layer on a cemented carbide insert by CVD technique without eta phase formation and without etching of the binder phase comprising operating a CVD coating process with a pressure during the whole process between 750 mbar and atmospheric and a temperature between 900 and 970° C., introducing gases in the order H$_2$, N$_2$, optionally CH$_4$ and TiCl$_4$, followed by HCl, keeping the amount of TiCl$_4$ between 1.5% and 5% and the amount of HCl between 1.0% and 6%.

25. The method of claim 7 wherein the pressure during the whole process is above 900 mbar.

26. The method of claim 7 wherein the amount of TiCl$_4$ is between 2.0% and 3.5%.

27. The method of claim 7 wherein the amount of HCl is between 1.5% and 4%.

* * * * *